US011293697B2

(12) United States Patent
Kitazaki et al.

(10) Patent No.: US 11,293,697 B2
(45) Date of Patent: Apr. 5, 2022

(54) COOLING DEVICE

(71) Applicant: TOSHIBA ELECTRO-WAVE PRODUCTS CO., LTD., Kawasaki (JP)

(72) Inventors: Toshihiro Kitazaki, Kawasaki (JP); Naoya Akaishi, Tokyo (JP)

(73) Assignee: TOSHIBA ELECTRO-WAVE PRODUCTS CO., LTD., Kawasaki (JP)

(*) Notice: Subject to any disclaimer, the term of this patent is extended or adjusted under 35 U.S.C. 154(b) by 0 days.

(21) Appl. No.: 17/087,823

(22) Filed: Nov. 3, 2020

(65) Prior Publication Data

US 2021/0190431 A1 Jun. 24, 2021

(30) Foreign Application Priority Data

Dec. 19, 2019 (JP) ............................ JP2019-229368

(51) Int. Cl.
*F28D 1/03* (2006.01)
*F28D 1/02* (2006.01)

(52) U.S. Cl.
CPC ......... *F28D 1/0366* (2013.01); *F28D 1/0246* (2013.01)

(58) Field of Classification Search
CPC .. F28D 1/0366; F28D 1/0246; F28F 2215/04; F28F 3/04; H05K 7/20254
See application file for complete search history.

(56) References Cited

U.S. PATENT DOCUMENTS

| | | | | |
|---|---|---|---|---|
| 6,032,503 | A * | 3/2000 | Grippe | B21D 13/04 72/186 |
| 6,515,862 | B1 * | 2/2003 | Wong | H01L 23/467 165/121 |
| 2003/0056942 | A1 * | 3/2003 | Ota | H01L 23/427 165/104.33 |
| 2010/0154788 | A1 * | 6/2010 | Wells | H01L 31/054 126/658 |
| 2017/0082372 | A1 | 3/2017 | Vos et al. | |
| 2019/0086160 | A1 * | 3/2019 | Lu | F28F 1/126 |
| 2021/0102760 | A1 * | 4/2021 | Nakamura | F28F 3/04 |

FOREIGN PATENT DOCUMENTS

| | | |
|---|---|---|
| FR | 2 960 707 A1 | 12/2011 |
| JP | 3-289705 A | 12/1991 |
| JP | 2004-14608 A | 1/2004 |

(Continued)

OTHER PUBLICATIONS

Japanese Office Action dated Mar. 30, 2021 in Japanese Patent Application No. 2019-229368, citing documents AO through AQ therein, 3 pages.

(Continued)

*Primary Examiner* — Jon T. Schermerhorn, Jr.
(74) *Attorney, Agent, or Firm* — Oblon, McClelland, Maier & Neustadt, L.L.P.

(57) ABSTRACT

According to one embodiment, a cooling device includes a heat releasing element including a surface configured to contact a heat generating element and an internal fluid channel configured to flow a cooling medium. The cooling device also includes a plurality of cooling fins within the fluid channel, each of which extends in a direction crossing a flow direction of the cooling medium and has a zigzag, corrugated shape defined by multiple bent portions.

4 Claims, 4 Drawing Sheets

(56) References Cited

FOREIGN PATENT DOCUMENTS

| | | | |
|---|---|---|---|
| JP | 2005-85887 | A | 3/2005 |
| JP | 2011-244266 | A | 12/2011 |
| JP | 2016-25349 | A | 2/2016 |
| JP | 2019-107680 | A | 7/2019 |

OTHER PUBLICATIONS

Extended European Search Report dated May 10, 2021 in European Patent Application No. 20205357.5, citing documents AA, AO, and AP therein, 7 pages.

* cited by examiner

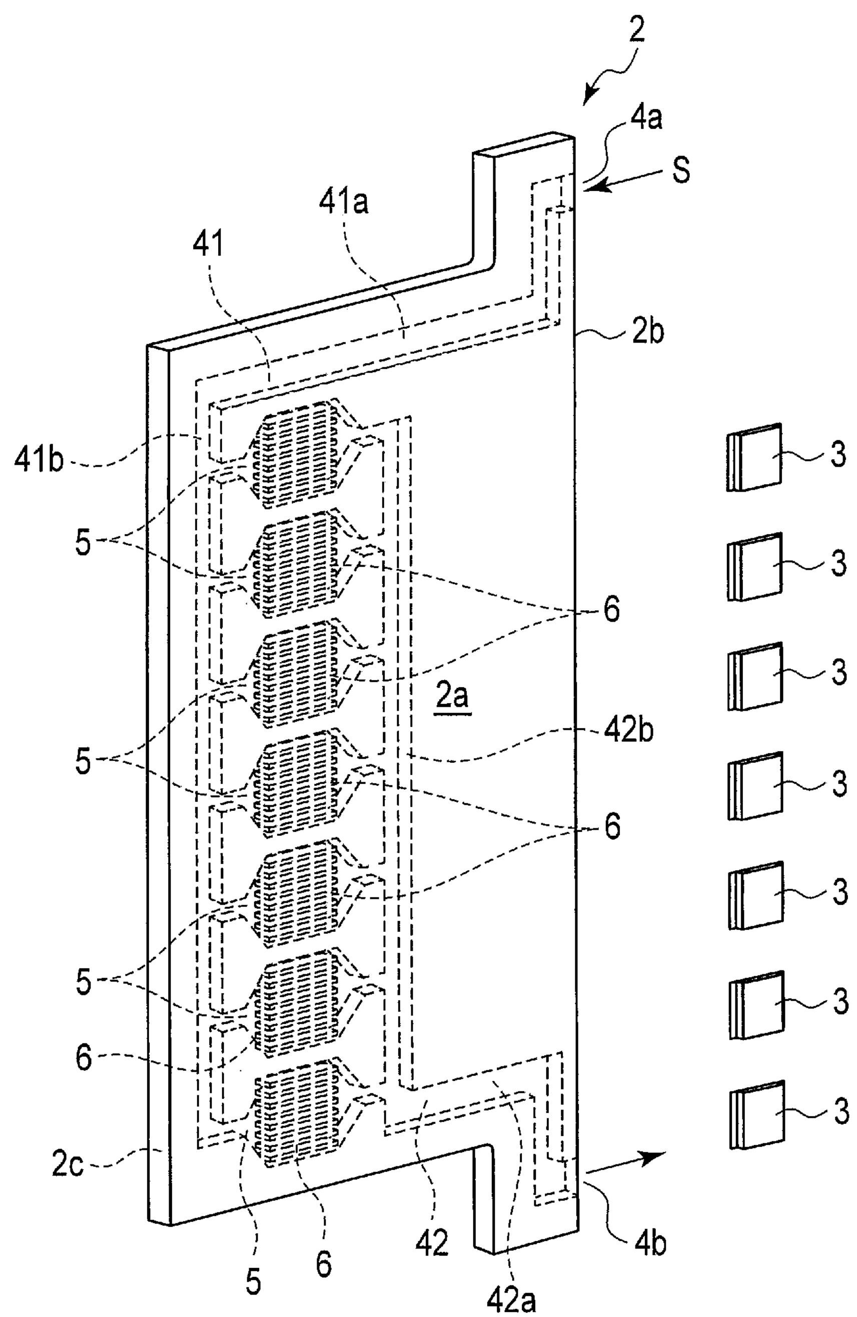
F I G. 2

COOLING DEVICE

CROSS-REFERENCE TO RELATED APPLICATIONS

This application is based upon and claims the benefit of priority from Japanese Patent Application No. 2019-229368, filed Dec. 19, 2019; the entire contents of which are incorporated herein by reference.

FIELD

Embodiments described herein relate generally to a cooling device that uses fluid-cooled cold plates for cooling, for example, semiconductor elements in an active phased array antenna.

BACKGROUND

An active phased array antenna includes multiple semiconductor elements at pitches depending on the frequency of radio waves to generate. The active phased array antenna involves high power outputs and, as such, its semiconductor elements can generate a large amount of heat and require cooling for suppressing variations in their electrical performance due to temperature changes. Accordingly, the semiconductor elements in the active phased array antenna are arranged at predetermined pitches and in contact with a cooling device such as a fluid-cooled cold plate.

It is expected that semiconductor elements for use in an active phased array antenna in the future will generate about 10 times more heat than they do today. Attempts to improve cooling capability for a limited space are ongoing, and include reducing the thickness of a cooling fin of each fluid-cooled cold plate, minimizing the fin pitches, and so on. However, the processing accuracy for the cooling fins is now approaching its limit. One thinkable measure is to expand the area for disposing the cooling fins so that more cooling fins can be employed; however, the semiconductor elements for given frequencies do not tolerate the pitches to be varied, so this measure is not feasible.

Accordingly, there is a demand for a cooling device that can realize an improved cooling capability for a limited space without increasing the number of cooling fins.

BRIEF DESCRIPTION OF THE DRAWINGS

FIG. 2 is a perspective view of one fluid-cooled cold plate of the heat releasing unit of FIG. 1, from which the semiconductor elements have been detached.

DETAILED DESCRIPTION

Figure 1:
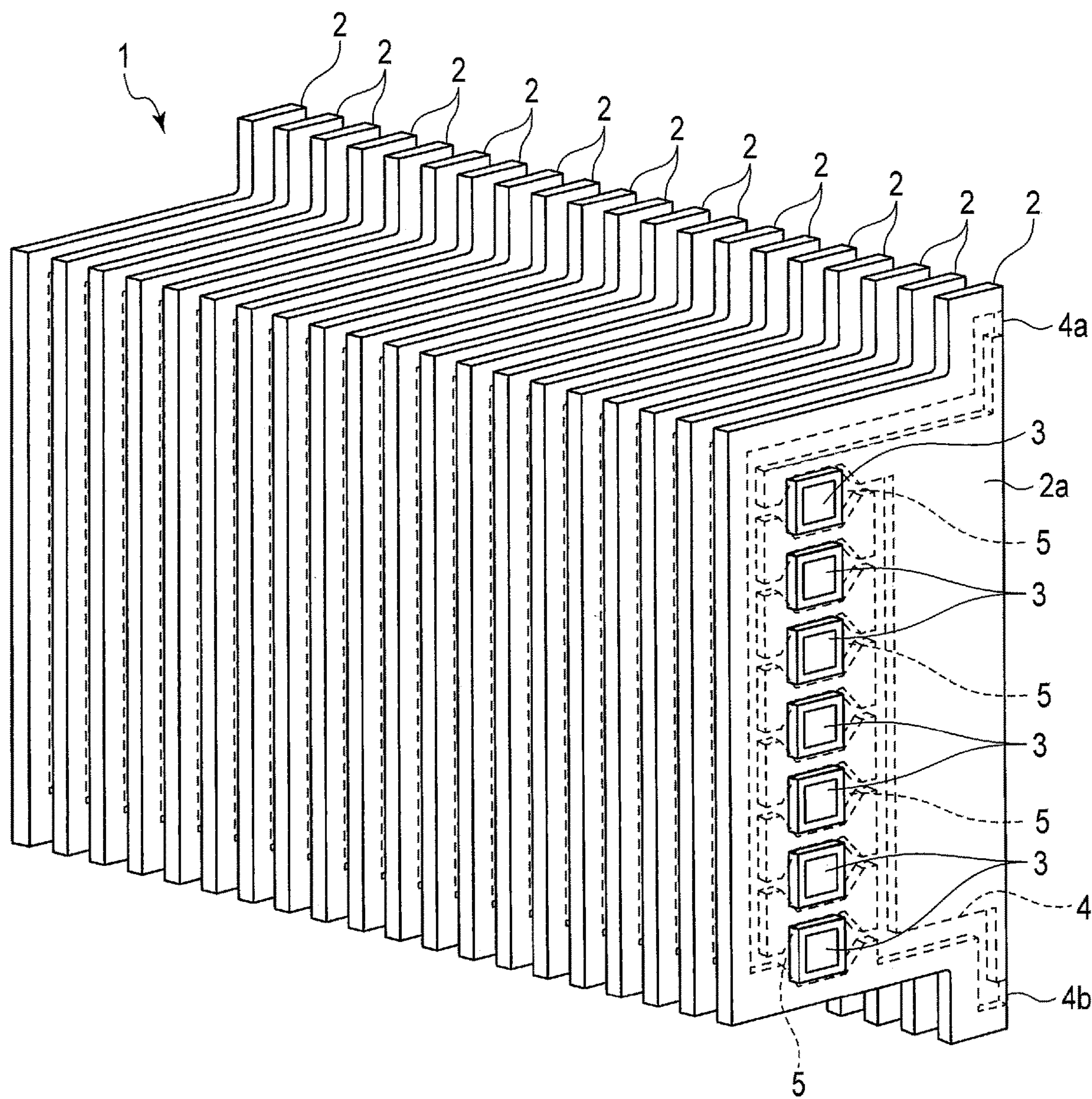
FIG. 1 is a schematic diagram showing an exemplary heat releasing unit according to a certain embodiment.

According to one embodiment, a cooling device includes a heat releasing element including a surface configured to contact a heat generating element and an internal fluid channel configured to flow a cooling medium. The cooling device also includes a plurality of cooling fins within the fluid channel, each of which extends in a direction crossing a flow direction of the cooling medium and has a zigzag, corrugated shape defined by multiple bent portions.

In this cooling device, the cooling fins disposed inside the fluid channel of the heat releasing element that contacts the heat generating element are each formed into a zigzag, corrugated shape defined by multiple bent portions. Thus, the cooling device according to the embodiment increases the surface area of each cooling fin as compared to a flat plate-shaped cooling fin, and can accordingly improve the cooling capability for a limited space in the cooling device, without reducing the thickness of each cooling fin or increasing the number of cooling fins.

According to one embodiment, the cooling fins of the cooling device include a plurality of first cooling fins aligned at predetermined pitches in a direction transverse to the flow direction, and a plurality of second cooling fins next to the first cooling fins in the flow direction and aligned at predetermined pitches in the direction transverse to the flow direction. The first fins and the second fins differ from each other in phase of the corrugated shape.

In this cooling device, the first cooling fins are aligned at predetermined pitches in the direction transverse to the flow direction of the cooling medium, and the second cooling fins are provided next to the first cooling fins in the flow direction and aligned at predetermined pitches in the direction transverse to the flow direction. The first fins and the second fins differ from each other in phase of the corrugated shape. Thus, the cooling device according to the embodiment allows the edge of the first and second cooling fins to each efficiently contact the cooling medium on the side where the cooling medium flows in, and can accordingly take out heat from each fin in an efficient manner. The cooling device therefore realizes a further improved cooling capability for the good of the heat generating elements.

According to one embodiment, the heat releasing element and the cooling fins of the cooling device are integral and seamlessly formed through additive manufacturing with a metal material.

In this cooling device, the heat releasing element and the cooling fins are integral as being seamlessly formed through additive manufacturing with a metal material. That is, this cooling device can be produced as a cooling device of a seamless structure. Thus, the cooling device according to the embodiment can eliminate an occurrence of, for example, water leakage trouble when water as the cooling medium is introduced and flowed through the fluid channel. Accordingly, the cooling device according to the embodiment can also prevent an occurrence of electrical leakage due to the leaked water, as well as a malfunction of an electronic device having incorporated the cooling device as its component. Moreover, since the cooling device according to the embodiment is free from leakage trouble, it can omit a leak test with the cooling medium. As a result, the cooling device according to the embodiment can cut the cost associated with conducting a leak test, and the entire costs for manufacturing the cooling device can accordingly be reduced.

Now, an embodiment will be described with reference to the drawings.

As shown in FIG. 1, a heat releasing unit (cooling device) 1 includes a plurality (20 in this exemplary embodiment) of substantially quadrilateral plate-shaped fluid-cooled cold plates 2. The fluid-cooled cold plates 2 are plate members sharing substantially the same structure, and they are arranged close to one another with an interval in their thickness direction and in mutually parallel postures with their edges aligned as illustrated in the figure. The fluid-cooled cold plates 2 in this postures are intended to be set in a slot (not illustrated) of an electronic device (not illustrated), respectively. Examples of the electronic device include an active phased array antenna. The description will assume the heat releasing unit 1 according to the embodiment to be a component incorporated and used in a high-output active phased array antenna (which may be simply called "high-output antenna" below).

The fluid-cooled cold plates 2 each have one face ("surface 2*a*") provided with a plurality (7 in this exemplary embodiment) of semiconductor elements 3 as heat generating elements aligned in line at predetermined pitches. The pitches of the semiconductor elements 3 in the high-output antenna are determined depending on the frequency of radio waves for the high-output antenna to generate. To put it another way, high-output antennas which are intended for the same frequency adopt substantially the same pitches for their semiconductor elements 3. Note also that, as a future outlook, the semiconductor elements 3 for use in a high-output antenna are expected to increase their heat generation amount about tenfold.

When such semiconductor elements 3 for which pitches must be set according to the frequency of radio waves indeed increase the heat generation amount in the future, it is not possible to upsize the fluid-cooled cold plate 2 and increase the pitches of the semiconductor elements 3 to adequately cool the semiconductor elements 3. As such, it will be a requisite to improve the cooling capability of the fluid-cooled cold plate 2 for a limited space. The embodiments herein offer solutions to this problem.

As shown in FIG. 2, each fluid-cooled cold plate 2 includes internal fluid channel 4 for a cooling medium for cooling the semiconductor elements 3 to flow. The cooling medium may be water, for example. The fluid channel 4 has a flow-in port 4*a* at one end for introducing the cooling medium, and a flow-out port 4*b* at the other end for discharging the cooling medium. The fluid channel 4 is closed except at the flow-in port 4*a* and the flow-out port 4*b*. The flow-in port 4*a* and the flow-out port 4*b* both open in one longitudinally-extending end face 2*b* of the fluid-cooled cold plate 2. In the exemplary structure shown in the figure, the flow-in port 4*a* is located near the top of the end face 2*b*, and the flow-out port 4*b* is located near the bottom of the end face 2*b*. The fluid-cooled cold plate 2 is intended to be set in the orientation as shown in the figure, where the flow-in port 4*a* comes above the flow-out port 4*b* in the direction of gravity. This setting accordingly facilitates the cooling medium that has been introduced into the fluid channel 4 from the flow-in port 4*a*, to flow in the direction of gravity and to be discharged from the flow-out port 4*b*. The flow-in port 4*a* is connected to a pump (not illustrated) that is adapted to feed the cooling medium into the fluid channel 4 at predetermined flow rate.

FIGS. 1 and 2 each show the fluid channel 4 using dashed lines. There are a plurality (7 in this exemplary embodiment) of cooling chambers 5 in the middle of the fluid channel 4. The cooling chambers 5 each have a width greater than the width of the fluid channel 4. The cooling chambers 5 are provided at positions facing the respective, corresponding semiconductor elements 3 mounted on the surface 2*a* of the cold plate 2. In other words, the cooling chambers 5 are aligned straight at predetermined pitches in the longitudinal direction of the cold plate 2. Inside each cooling chamber 5 are integrally provided multiple cooling fins 6, which will be described in detail later.

The fluid-cooled cold plate 2 is integrally formed through additive manufacturing with a metal material. That is, the fluid channel 4, the cooling chambers 5, and the cooling fins 6 are also integrally formed through the additive manufacturing. The resultant fluid-cooled cold plate 2 according to the embodiment thus has a seamless structure, which does not pose a risk of leakage of the cooling medium flowing in the fluid channel 4.

The fluid channel 4 includes a flow-in side channel 41 connected to the flow-in port 4*a*, and a flow-out side channel 42 connected to the flow-out port 4*b*. The flow-in side channel 41 has an L-shaped profile constituted by a portion 41*a* extending in the vicinity of the top of the cold plate 2 from the flow-in port 4*a*, and a portion 41*b* connected with the portion 41*a* and extending along an end face 2*c* opposite the end face 2*b* in which the flow-in port 4*a* opens. The flow-out side channel 42 also has an L-shaped profile constituted by a portion 42*a* extending in the vicinity of the bottom of the cold plate 2 from the flow-out port 4*b*, and a portion 42*b* connected with the portion 42*a* and longitudinally extending through the approximate center of the cold plate 2.

The portion 41*b* of the flow-in side channel 41, which extends along the end face 2*c*, and the portion 42*b* of the flow-out side channel 42, which extends through the approximate center, are formed parallel to each other with the cooling chambers 5 sandwiched therebetween. In other words, the cooling chambers 5 are each communicated with the portion 41*b* of the flow-in side channel 41 at one end, and with the portion 42*b* of the flow-out side channel 42 at the other end. As such, the cooling medium that has introduced into the fluid channel 4 of the cold plate 2 from the flow-in port 4*a* flows through the two portions 41*a* and 41*b* of the flow-in side channel 41 and enters the cooling chambers 5. Then, the cooling medium, after having passed the multiple cooling fins 6 in each cooling chamber 5, flows through the two portions 42*a* and 42*b* of the flow out side channel 42 and is discharged out of the cold plate 2 from the flow-out port 4*b*.

The semiconductor elements 3 on the surface 2*a* of the cold plate 2 generate heat, which is transferred to the cold plate 2 via the surface 2*a*. The heat transferred to the cold plate 2 is then transferred to the cooling medium via the multiple cooling fins 6 in the cooling chambers 5 connected to the fluid channel 4, and is discharged out of the cold plate 2 together with the flowing cooling medium. Note that the cooling efficiency of the cold plate 2 can be enhanced by increasing the surface areas of the cooling fins 6.

Figure 3:
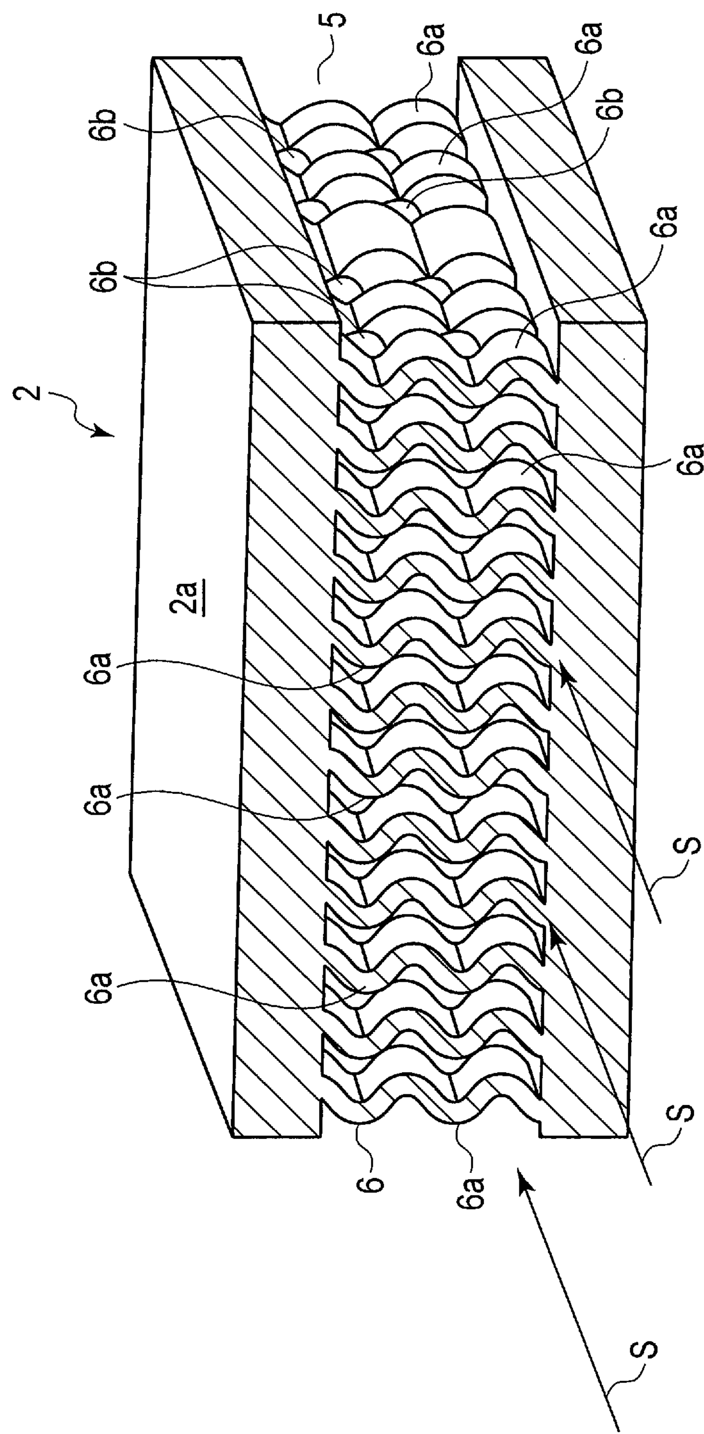
FIG. 3 is an enlarged perspective view of a part of the main structure of the fluid-cooled cold plate of FIG. 2.
Figure 4:
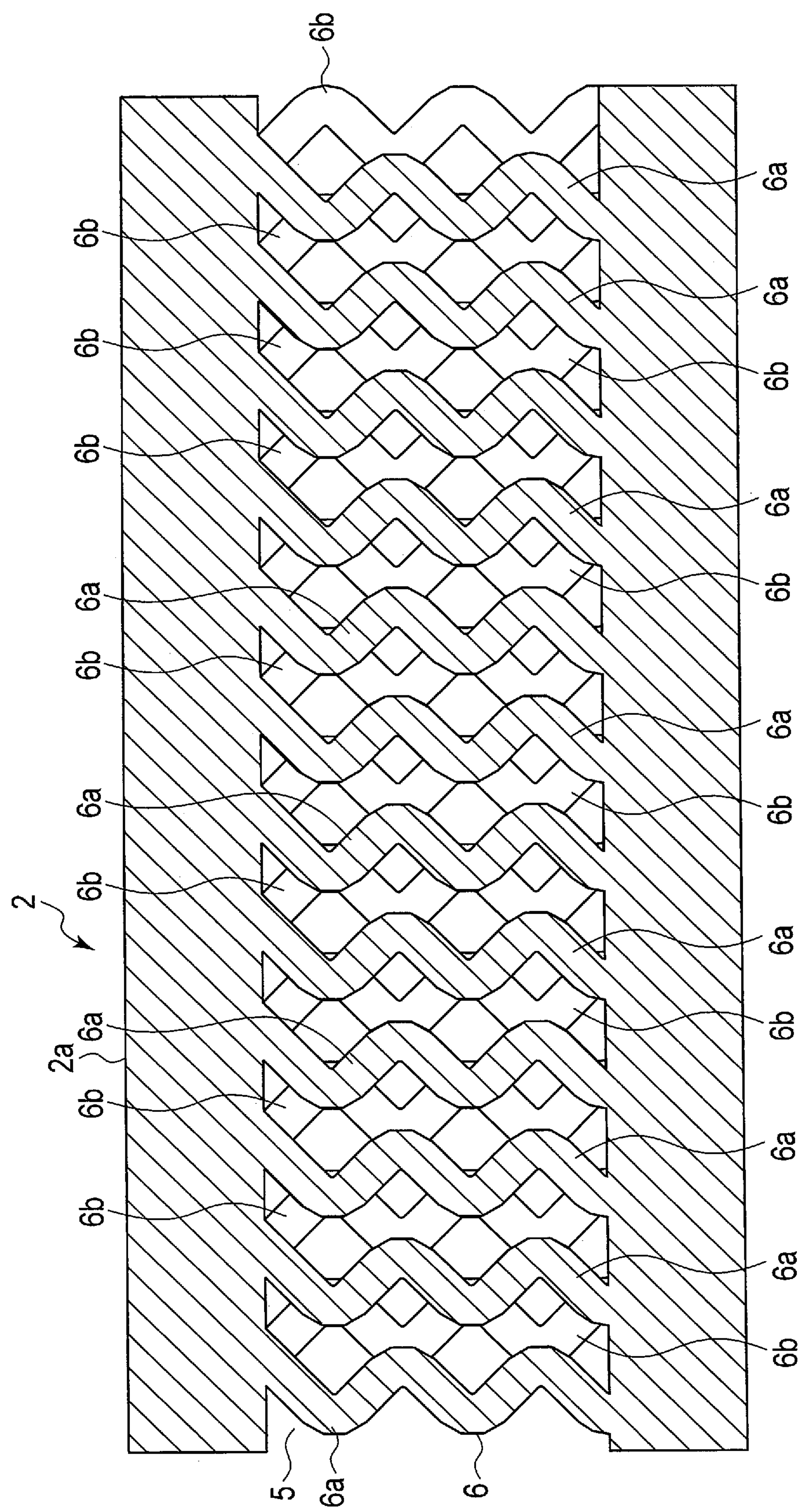
FIG. 4 is a front view of the structure of FIG. 3, seen along an arrow S (flow direction of a cooling medium).

FIG. 3 is a perspective view showing a part of the internal structure of one cooling chamber 5 provided in the middle of the fluid channel 4. FIG. 4 is a front view of the structure of FIG. 3, seen in the flow direction of the cooling medium (along an arrow S indicated in FIG. 3).

In each cooling chamber 5, the multiple corrugated cooling fins 6 are provided. The cooling fins 6 each have a shape which appears a slender and rectangular strip bent at multiple locations along its longitudinal direction in a zigzag manner. This shape is called a "corrugated shape" in this disclosure. By adopting such a corrugated shape, each cooling fin 6 can have a surface area larger than that of a flat plate fin that spans the same length range. The multiple cooling fins 6 have substantially the same shape and each extend in the direction crossing the flow direction S of the cooling medium within the cooling chamber 5. In this exemplary embodiment, all the cooling fins 6 are provided to extend in the thickness direction of the cold plate 2 (only some of the cooling fins 6 are shown in FIG. 3).

The multiple cooling fins 6 include multiple first cooling fins 6*a* aligned at predetermined pitches in a direction orthogonal to the thickness direction of the cold plate 2 and transverse to the flow direction S of the cooling medium (that is, in substantially the horizontal direction in FIGS. 3 and 4). The first cooling fins 6*a* are formed so that their respective end faces on the upstream side in the flow direction S of the cooling medium are flush with one another on a virtual plane orthogonal to the flow direction S. The multiple cooling fins 6 further include multiple second cooling fins 6*b* adjacent to the first cooling fins 6*a* on the downstream side in the flow direction S of the cooling medium. The second cooling fins 6*b*, too, are aligned at predetermined pitches in the direction transverse to the flow direction S of the cooling medium. The second cooling fins 6*b* are also formed so that their respective end faces on the upstream side in the flow direction S of the cooling medium are flush with one another on a virtual plane orthogonal to the flow direction S. Note that the second cooling fins 6*b* are disposed in such a layout that they overlap with the first cooling fins 6*a* in the flow direction S, while showing the corrugated shape different in phase from the corrugated shape of the first cooling fins 6*a*. In other words, the second cooling fins 6*b* face the respective first cooling fins 6*a* in the flow direction S, and each have a horizontally flipped shape of the corresponding first cooling fin 6*a*.

The stage of the first cooling fins 6*a* and the stage of the second cooling fins 6*b* are alternately provided multiple times in the flow direction S of the cooling medium with the above-described layout maintained. There are no gaps in the flow direction S between the stage of the first cooling fins 6*a* and the stage of the second cooling fins 6*b*, so the corresponding cooling fins 6*a* and 6*b* are in contact with each other. Despite this, as the first cooling fins 6*a* and the second cooling fins 6*b* are of the horizontally flipped shape of each other, the overlapping area between the stage of the first cooling fins 6*a* and the stage of the second cooling fins 6*b* adjacent in the flow direction S is relatively small. This means that, when the cooling medium flows in the flow direction S, the cooling medium will contact relatively large areas of the upstream-side end faces of the first cooling fins 6*a* and those of the second cooling fins 6*b*.

According to an aspect of the embodiment as described above, the multiple cooling fins 6 (6*a* and 6*b*) provided in the fluid channel 4 of the fluid-cooled cold plate 2 each have a zigzag, corrugated shape defined by multiple bent portions. Thus, the surface area of each cooling fin 6 is made larger than that of a flat plate-shaped cooling fin. Therefore, the cooling capability of the cold plate 2 for a limited space can be improved without reducing the thickness of each cooling fin 6 or increasing the number of the cooling fins 6. That is, the fluid-cooled cold plates 2 following the foregoing embodiment can be suitably employed for cooling the semiconductor elements 3 in a high-output active phased array antenna.

According to an aspect of the embodiment, the stage of the first cooling fins 6*a* and the stage of the second cooling fins 6*b* are alternately provided multiple times along the flow direction, while the first cooling fins 6*a* and the respective, corresponding second cooling fins 6*b* are arranged to overlap each other with their corrugated shapes differentiated in phase. Thus, it is possible to allow the edges of the first cooling fins 6*a* and the second cooling fins 6*b* to each efficiently contact the cooling medium on the side where the cooling medium flows in. Also, in each cooling fin 6, the local heat transfer rate at the portion near the upstream-side end that contacts the cooling medium is higher than the local heat transfer rate at the portion on the downstream side. Thus, by providing multiple stages of the cooling fins 6*a* and 6*b* in the flow direction S of the cooling medium, heat can be efficiently taken out from each of the cooling fins 6*a* and 6*b*. The embodiment can therefore realize an improved capability of cooling the semiconductor elements 3.

According to an aspect of the embodiment, the fluid-cooled cold plates 2 are each integrally formed through additive manufacturing with a metal material. Thus, the cold plates 2 each having a seamless structure can be produced. Consequently, it is possible to eliminate an occurrence of water leakage trouble when water as the cooling medium is introduced and flowed through the fluid channel 4. It is also possible to prevent an occurrence of electrical leakage due to the leaked water, as well as a malfunction of an electronic device having incorporated one or more cold plates 2 as its component. Moreover, since the possibility of leakage trouble is eliminated, the cold plates 2 can omit a leak test with the cooling medium. As a result, costs associated with conducting a leak test can be cut, and the entire costs for producing the cold plates 2 can accordingly be reduced.

Additionally, since the fluid-cooled cold plates 2 following the embodiment are of the seamless structure as described above, they have a reduced thermal resistance as well. It has been confirmed that each cold plate 2 following the embodiment shows a reduced thermal resistance as compared to, for example, a cold plate that follows the conventional art where multiple flat, comb-shaped cooling fins obtained by cutting processes are brazed together with another metal plate to form a fluid channel.

Note that the description of the foregoing embodiment has assumed the arrangement where the multiple cooling fins 6*a* and 6*b* are orderly aligned within the fluid channel 4 of the fluid-cooled cold plate 2, but this is not a limitation. The embodiment may adopt any arrangement as long as the cooling fins 6 each having the corrugated shape or the like for increasing the surface area are provided within the fluid channel 4 for the cooling medium. Postures and a layout of the cooling fins 6 may be discretionarily modified. Moreover, while the description of the embodiment has assumed the instances where the cooling fins 6 are each formed into the corrugated shape, the embodiment may adopt any shape for the cooling fins 6 as long as increased surface areas are realized within the same space for their formation.

Note also that the description of the embodiment has assumed the alignment of the cooling fins 6 which are of the same shape and the same size, but this is not a limitation. The embodiment may use more than one type of cooling fins differing in shape, etc. in combination, for arrangement in the fluid channel 4. Also, the cooling fins 6 may not have to uniformly face in one direction. Some or all of the cooling fins 6 may also be inclined with respect to the flow direction S of the cooling medium.

While the description of the embodiment has assumed the use of water as the cooling medium, this is not a limitation. The embodiment may use any cooling medium including, for example, an inert fluid which does not corrode metals.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A cooling device comprising:

a heat releasing element including a surface configured to contact a heat generating element, and an internal fluid channel configured to flow a cooling medium; and a plurality of cooling fins within the fluid channel, the plurality of cooling fins each extending in a direction crossing a flow direction of the cooling medium and having a zigzag, corrugated shape defined by multiple bent portions viewed from the flow direction, wherein the plurality of cooling fins comprise:

a plurality of first cooling fins aligned at predetermined pitches in a direction transverse to the flow direction, and a plurality of second cooling fins next to the first cooling fins in the flow direction and aligned at predetermined pitches in the direction transverse to the flow direction, the second cooling fins facing the respective first cooling fins in the flow direction, and each of the second cooling fins having a horizontally flipped shape of a corresponding first cooling fin.

2. The cooling device according to claim 1, wherein the heat releasing element and the cooling fins are integral and seamlessly formed through additive manufacturing with a metal material.

3. The cooling device according to claim 1, wherein a stage of the first cooling fins and a stage of the second cooling fins are formed within the fluid channel, the first cooling fins being aligned at the predetermined pitches in the direction transverse to the flow direction in the stage of the first cooling fins, and the second cooling fins being aligned at the predetermined pitches in the direction transverse to the flow direction in the stage of the second cooling fins, and the stage of the first cooling fins and the stage of the second cooling fins are alternately provided multiple times in the flow direction within the flow channel.

4. The cooling device according to claim 1, wherein in the zigzag, corrugated shape of each of the cooling fins, an extending part between adjacent two of the bent portions is inclined relative to the direction transverse to the flow direction.

* * * * *